US008279619B2

(12) United States Patent
Leverenz et al.

(10) Patent No.: US 8,279,619 B2
(45) Date of Patent: Oct. 2, 2012

(54) POINT OF LOAD (POL) POWER SUPPLY SYSTEMS WITH REPLACEMENT MODULE

(75) Inventors: Howard Leverenz, Houston, TX (US); Mohamed Amin Bemat, Houston, TX (US); Reynaldo P. Domingo, Houston, TX (US); Kailash Kishore Mirpuri, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 301 days.

(21) Appl. No.: 12/731,687

(22) Filed: Mar. 25, 2010

(65) Prior Publication Data

US 2011/0235294 A1    Sep. 29, 2011

(51) Int. Cl.
H05K 7/00    (2006.01)

(52) U.S. Cl. .......................... 361/777; 361/760; 361/781

(58) Field of Classification Search .................. 361/760, 361/767, 777, 781–783, 790, 792
See application file for complete search history.

(56) References Cited

U.S. PATENT DOCUMENTS

| 7,000,125 | B2 | 2/2006 | Chapuis et al. |
| 7,027,305 | B2* | 4/2006 | Keating et al. ................ 361/719 |
| 7,249,267 | B2 | 7/2007 | Chapuis |
| 7,266,709 | B2 | 9/2007 | Chapuis et al. |
| 7,402,958 | B2 | 7/2008 | Nguyen |
| 2004/0263133 | A1 | 12/2004 | Nguyen |
| 2007/0124612 | A1 | 5/2007 | Chapuis et al. |
| 2008/0052551 | A1* | 2/2008 | Chapuis et al. ............... 713/340 |
| 2008/0253158 | A1* | 10/2008 | Mochikawa et al. ......... 363/133 |

FOREIGN PATENT DOCUMENTS

| WO | WO 9412368 | 6/1994 |
| WO | WO 2009058523 | 5/2009 |

* cited by examiner

*Primary Examiner* — Hoa C Nguyen

(57) ABSTRACT

A method for fabricating a point-of-load (POL) power supply system can include providing a circuit board. The circuit board can include a first set of connections configured for coupling a predetermined first portion of components of a voltage regulator down (VRD) system to the circuit board and a second set of connections configured for coupling a replacement module to the circuit board. Each of the first set of connections and the second set of connections is electrically coupled with a third set of connections that is configured for coupling a second portion of components of the VRD system to the circuit board. The second portion of components of the VRD system is connected to the circuit board. The replacement module is connected onto the circuit board via the second set of connections such that the replacement module and the second portion of components of the VRD system cooperate to provide at least a portion of the POL system.

15 Claims, 4 Drawing Sheets

US 8,279,619 B2

POINT OF LOAD (POL) POWER SUPPLY SYSTEMS WITH REPLACEMENT MODULE

BACKGROUND

Point of load (POL) power supply systems can be implemented to provide power to a variety of electronic systems. As an example, one or more POL power supply systems can be implemented on computers, such as personal computers or servers, to provide power to processors, memory devices, and/or other electronic devices. In more recent manufacture of computers, voltage regulator down (VRD) systems have been implemented as POL power supply systems by employing components resident on the associated motherboard(s).

DETAILED DESCRIPTION

Figure 1:
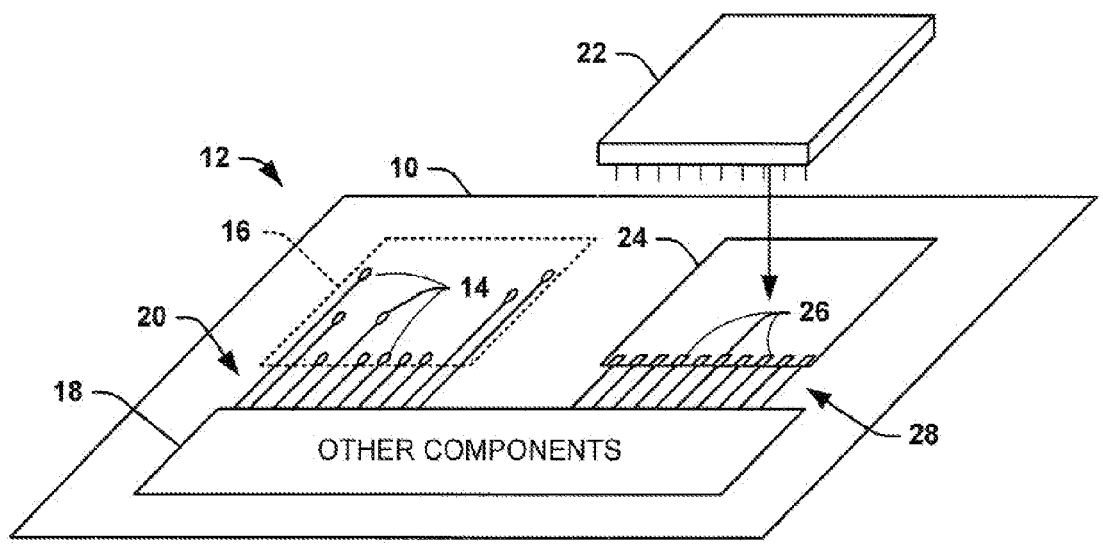
FIG. 1 illustrates an example embodiment of a circuit board.

FIG. 1 illustrates an example embodiment of a circuit board 10. The circuit board 10 can be configured in a variety of computer systems, such as a server or a personal computer. As an example, the circuit board 10 can be a printed circuit board (PCB), such as a motherboard, which includes a number of electronic and electrically conducting components configured and arranged according to application requirements. As used herein, the circuit board 10 can be any structure configured to mechanically support and electrically connect electronic components via conductive pathways, tracks or traces laminated onto a non-conductive substrate. Those skilled in the art will understand and appreciate various forms and configurations of circuit boards that can be utilized.

In the example of FIG. 1, the circuit board 10 is configured to employ one or more point of load (POL) power supply system 12 that includes a primary voltage regulator down (VRD) system. The VRD system can include a plurality of circuit components designed to be resident on the circuit board 10. That is, the circuit board 10 is configured for receiving the components that form the VRD system. For the example of FIG. 1, the components of the VRD system are separated into a first portion of components, indicated at 16, which can be mounted to a corresponding area of the circuit board 10, and a second portion of components 18. The POL system 12 can be configured to provide power to one or more electronic systems that can be included on the circuit board 10 or on other components of the associated computer system. It is to be understood that the circuit board 10 is not limited to just the POL power supply system 12, but that a variety of additional components not demonstrated in the example of FIG. 1 can likewise be included on the circuit board 10.

By way of further example, the circuit board 10 includes a set of connections 14 for connecting a first set of components of the VRD system. The set of connections 14 illustrated within the area indicated by dashed line 16 thus represent the first portion of components of the VRD system. Similarly, the second portion of components 18 of the VRD system (e.g., as well as other components for the circuit board 10) would also include a set of connections, but have been omitted from FIG. 1 for sake of illustration. As an example, the set of connections 14 can correspond to solder pads, surface mount pads, through holes or a combination of connection types to mount the components of the circuit board 10.

The first portion of components 16 of the VRD system can correspond to an input stage of the POL power supply system 12, such as can include a predetermined arrangement of control circuitry, drive circuitry and one or more switches. For example, the VRD system can include a switching controller, a switch driver, and/or at least one power switch (e.g., one or more metal-oxide semiconductor field effect transistor (MOSFET)) associated with the POL power supply system 12. The first portion of components 16 of the VRD system can be a set of discrete components that are separately coupled to the circuit board 10 via the set of connections 14. Alternatively, some or all of the first portion of components 16 can be implemented as an integrated package or subsystem.

The circuit board 10 also includes the second portion of components 18 in the VRD system. The second portion of components 18 are electrically coupled with at least a portion of the first portion of components 16 via electrical connections 20 (e.g., electrical traces through the circuit board 10). The second portion of components 18 can correspond to an output stage that can also provide feedback to the circuitry in the first portion of components 16 of the POL power supply system 12. For example, the second portion of components 18 can include an arrangement of components (e.g., filters, voltage or current stabilizing components and feedback circuitry) configured to provide a desired output signal based on a switched output signal provided by the first portion of components. The second portion of components 18 can be coupled to associated circuitry of the POL Power Supply System 12 and the electrical connections 20 via known manners of electrical connection (e.g., solder to through-holes or surface mount pads).

The circuit board 10 is also configured to receive a replacement POL module 22. The replacement module 22 is configured as a replacement or substitute for the first portion of components 16 in the VRD system. Thus, instead of utilizing the predetermined primary VRD system in the POL system 12, the first portion of components 16 is replaced by the preconfigured module 22 by connecting it to the circuit board 10 at a preconfigured auxiliary connection 26. For instance, the circuit board 10 can include an auxiliary area 24, which may be separate from the area configured for mounting the first set of components 16 and is configured with a set of predetermined connections 26 for electrically connecting the replacement module 22 to the circuit board and, specifically, to the POL system 12. The connections 26 can be implemented as a socket that is configured for electrically connecting the module to the second portion of components 18 of the circuit board 10. It will be understood and appreciated that the connections 26 for the auxiliary area 24 can be configured in a variety of ways to accommodate the replacement module 22, which can vary according to application requirements and design considerations for the circuit board 10.

The second portion of components 18 of the VRD system can be electrically coupled to the connections 26, such as via a set of electrically conductive traces 28. As one example, the same nodes of the second portion of components 18 in the VRD system can be electrically coupled to respective connections 14 for the first portion of components 16 and to respective the connections 26 in the auxiliary area 24. It will be appreciated that the auxiliary area can overlap with or even be the same as area in the VRD system in which the first portion of components 16 reside.

The replacement module 22 can correspond to an input stage of the POL power supply system 12, such as can include a predetermined arrangement of control circuitry, drive circuitry and one or more switches, similar to the first portion of components in the primary VRD system. The replacement module 22, upon being connected to the circuit board 10 via the connections 26, can allow the circuit board 10 to operate in the same manner as if the first portion of components 16 were instead attached to the connections 14. That is, the replacement module 22 can provide a predetermined alternative (e.g., an auxiliary or substitute) that affords substantially the same functionality as using the predetermined VRD system, such as when the first portion of components of the VRD system has failed or is otherwise unavailable. Thus, by configuring the circuit board 10 to receive the replacement module 22 and successfully testing the module in the POL system 12 in advance, various manufacturing delays can be prevented.

As a further example, if one or more parts of the first portion 16 of the VRD system are no longer available during manufacture of a batch of motherboards, the manufacturer could instead plug replacement modules 22 into each of the motherboards to avoid unwanted delays. Additionally, upon determining that VRD systems on motherboards are failing during a testing stage (e.g., due to defective components), the replacement modules 22 can be mounted in the area 24 instead of the first portion of components 16, such that manufacturing can be resumed.

The replacement module 22 and circuit board 10 can be designed and manufactured such that the second portion of components 18 can remain utilized in the POL system 12 regardless of whether the VRD system including the first portion of components 16 is implemented or the replacement module 22 is implemented. Alternatively, one or more components in the second portion of components 18 (e.g., corresponding to output and/or feedback circuitry) can be replaced with other components when utilizing the replacement module 22 in the POL system 12. Accordingly, by designing and manufacturing the circuit boards (e.g., motherboards) 10 with the auxiliary area 24 and associated connections 26, the manufacturer has versatility with respect to the installation of components of the POL power supply system 12 on the circuit board 10.

Figure 2:
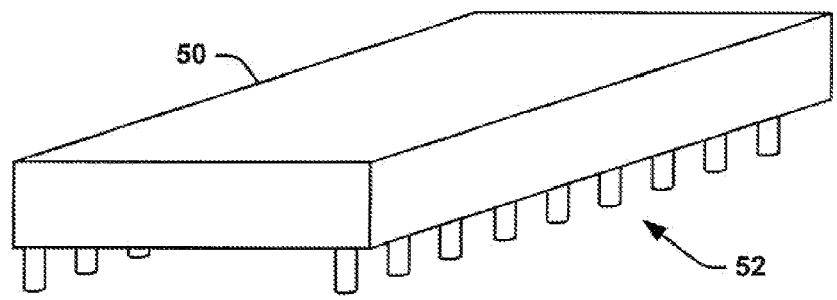
FIG. 2 illustrates an example embodiment of a replacement module.

FIG. 2 illustrates an example of a replacement module 50. The replacement module 50 is configured as substantially flat rectangular package. The module 50 can include circuitry configured to replace a selected portion of a VRD system, such as shown and described herein. The module 50 includes a plurality of pins 52 configured for connection with the corresponding connections 26 in the auxiliary area 24 (FIG. 1). For instance, the connections of the auxiliary area can be implemented as a socket with through-holes into which the module can be plugged for attachment with the circuit board 10. As an example, the replacement module 50 can be implemented as a dual in-line package (DIP) or as a pin grid array (PGA) package. In the example of FIG. 2, the replacement module 50 includes the pins 52 arranged in multiple rows, such as at long edges of the replacement module 50.

Figure 3:
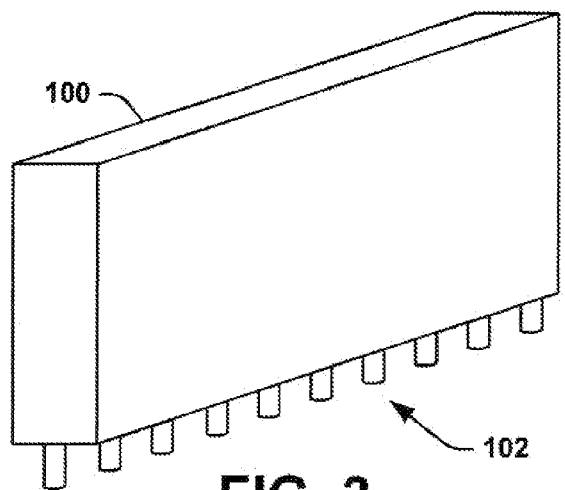
FIG. 3 illustrates another example embodiment of a replacement module.

FIG. 3 illustrates another example of a replacement module 100. The replacement module 100 is configured as substantially in-line version in which circuitry is mounted in a package that extends over a substantially linear arrangement of pins 102. For instance, the package of the module is rectangular but is arranged vertically over the set of pins 102. The module 100 thus would be oriented substantially perpendicular to the circuit board 10 when mounted on to the set of connections 26 (FIG. 1). In the example of FIG. 3, the replacement module 100 includes a plurality of pins 102, such as can be arranged in a single row. As an example, the replacement module 100 can be implemented when area on the circuit board 10 is limited, such that the area on the circuit board 10 can be conserved for other electronic components.

It is to be understood that the replacement modules 22, 50, and 100 are not intended to be limited to plug-in modules having pins that mate with an associated socket, such as the connections 26 for the module 22. As an example, the replacement modules 22, 50, and 100 could instead include solder pads, such that they could be coupled to associated connections on the circuit board 10. Thus, those skilled in the art will appreciate that the replacement modules 22, 50, and 100 can be configured to be mounted to the circuit board 10 in a variety of different ways.

Figure 4:
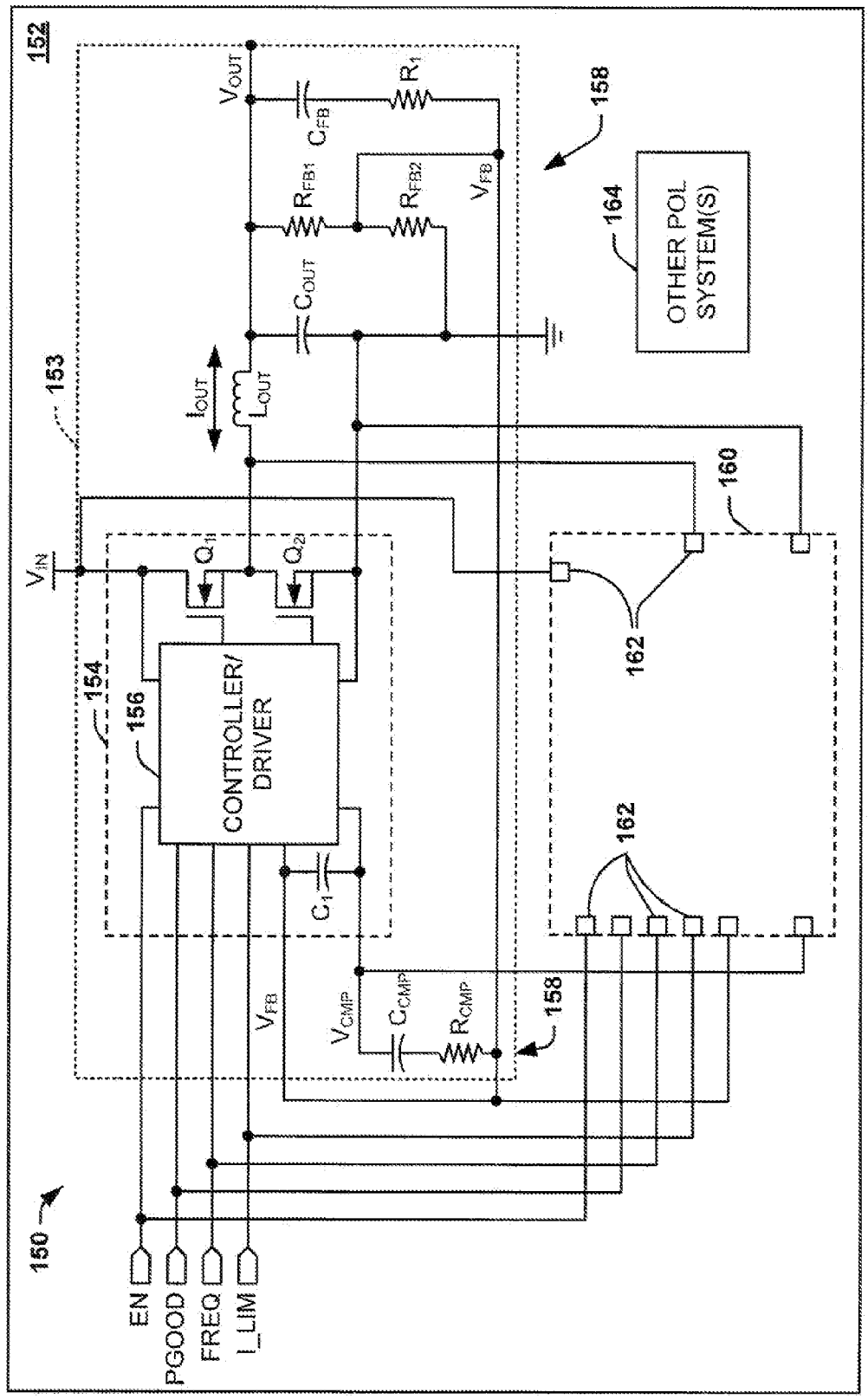
FIG. 4 illustrates an example embodiment of a schematic diagram of a POL power supply system.

FIG. 4 illustrates an example of a schematic diagram of a POL power supply system 150. The POL power supply system 150 can correspond to the POL power supply 12 in the example of FIG. 1. The POL power supply system 150 is mounted on a motherboard 152.

In the example of FIG. 4, the POL power supply system 150 is demonstrated as including a VRD system 153. The VRD system 153 includes a first portion of components 154, which includes a controller/driver 156. The VRD system 153 also includes a second portion of components 158, which includes output and feedback circuitry. The controller/driver 156 is configured to generate switching signals to a set of power switches, demonstrated in the example of FIG. 4 as $Q_1$ and $Q_2$. As an example, the controller/driver 156 can set a duty-cycle and sequence of switching of the power switches $Q_1$ and $Q_2$ in response to a set of input signals, demonstrated in the example of FIG. 4 as signals EN, PGOOD, FREQ, and I_LIM. The controller/driver 156 can also operate responsive to a feedback voltage $V_{FB}$ and a compensation voltage $V_{CMP}$ that are separated in the VRD system by a capacitor $C_1$.

As an example, the first portion of components 154 of the VRD system 153 can be configured such that one or more of the controller/driver 156, the power switches $Q_1$ and $Q_2$ and capacitor $C_1$ are individual (e.g., discrete or separate). Alternatively, components can be combined and integrated as a single package. As another example, the controller/driver 156 is not limited to being configured as a single device, but could be configured as plural separate discrete devices.

The power switches $Q_1$ and $Q_2$ are controlled according to drive signals from the controller/driver 156 to generate an output current $I_{OUT}$ through an output inductor $L_{OUT}$. The output current $I_{OUT}$ thus establishes an output voltage $V_{OUT}$ across an output capacitor $C_{OUT}$ and across feedback resistors $R_{FB1}$ and $R_{FB2}$. The feedback resistors $R_{FB1}$ and $R_{FB2}$ are configured as a voltage divider to generate the feedback voltage $V_{FB}$ based on the output voltage $V_{OUT}$. The feedback voltage $V_{FB}$ and the output voltage $V_{OUT}$ are also separated by a series connection of a capacitor $C_{FB}$ and a resistor $R_1$. Similarly, the feedback voltage $V_{FB}$ and the compensation voltage $V_{CMP}$ are separated by a series connection of a capacitor $C_{CMP}$ and a resistor $R_{CMP}$.

The circuit components $L_{OUT}$, $C_{OUT}$, $R_{FB1}$, $R_{FB2}$, $C_{FB}$, $R_1$, $C_{CMP}$, and $R_{CMP}$ can collectively constitute the second portion of components 158 in the VRD system 153. As an example, the second portion of components 158 can correspond to the second portion of components 18 in the example of FIG. 1. The second portion of components in the VRD system 153 can correspond to commonly available subset of the components, such as of the type that is readily commercially available from a plurality of different sources. In contrast, the first portion of components tends to be a more specialized type of components requiring significant design and testing efforts to ensure operability of the VRD system 153. The second portion of components 158 can be coupled to the motherboard 152, such as via solder or other types of electrical connection. In the example of FIG. 4, second portion of components 158 are electrically coupled to the VRD system 153, such as via electrical traces, and are also coupled to an auxiliary area 160. The auxiliary area 160 includes connections 162 configured for electrical connection with corresponding connectors of a replacement module. The connections 162 can be implemented as a socket that include a set of through-holes dimensioned and configured for receiving pins extending from a predetermined module (see, e.g., FIG. 4). Alternatively, the connections can be pads. That is, the connections 162 can be designed to accommodate a given type of connection, which can vary according to application requirements and equipment available for manufacturing the motherboard 152.

In view of the foregoing, it will be appreciated that the motherboard 152 can be manufactured with a set of connection points configured to electrically couple the VRD system 153 to the motherboard 152 and with the auxiliary set of connections 162. It will be further appreciated that a given motherboard can include one or more other POL systems 164. Each such POL system 164 can be similarly configured as the system 150. That is, a plurality of replacement modules can be connected to the motherboard 152 via preconfigured connections, such as in the event that one or more components in the first portion of the VRD system in each respective POL system 150, 164 is or becomes unavailable. In this way, the replacement module(s) can cooperate in conjunction with another portion of components to provide the respective POL power supply system 150, 164 operative to generate the output voltage $V_{OUT}$ for the motherboard. It will be understood that the replacement module for each POL power supply system 150, 164 can be the same or different depending on the portion of corresponding VRD circuit components being replaced.

Figure 5:
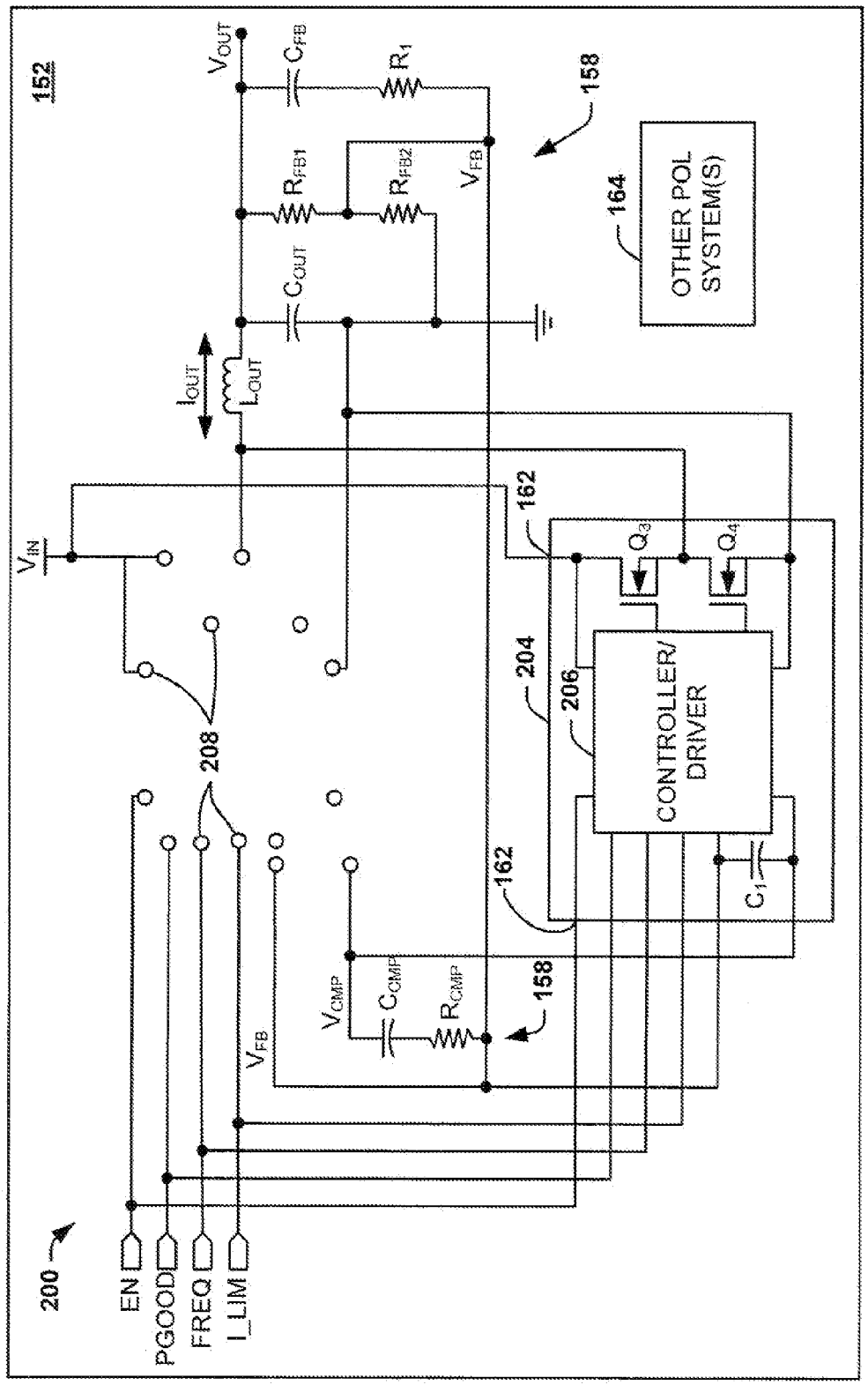
FIG. 5 illustrates another example embodiment of a schematic diagram of a POL power supply system.

FIG. 5 illustrates example of a schematic diagram of a POL power supply system 200. The POL power supply system 200 is similar in function to the POL power supply system 150 in the example of FIG. 4. In the example of FIG. 5, however, a replacement module 204 has been used to provide the POL power supply system 200 instead of the first portion of the VRD system as in the example of FIG. 4. Identical reference characters are used to refer to parts and feature previously introduced with respect to FIG. 4. Thus, reference is to be made to the example of FIG. 4 in the following description of the example of FIG. 5.

The replacement module 204 includes a controller/driver 206 that is configured to generate switching signals to a set of power switches, demonstrated in the example of FIG. 5 as $Q_3$ and $Q_4$. As an example, the controller/driver 206 can set a duty-cycle and sequence of switching of the power switches $Q_3$ and $Q_4$ in response to the set of input signals EN, PGOOD, FREQ, and I_LIM, as well as the feedback voltage $V_{FB}$ and the compensation voltage $V_{CMP}$. In the example of FIG. 5, the replacement module 204 can also include the capacitor $C_1$ that separates the feedback voltage $V_{FB}$ and the compensation voltage $V_{CMP}$ that is likewise included in the VRD system 153.

Even though the first portion of components 154 is not being utilized, the motherboard 152 is configured with a set of connections 208 to which the first portion of components 154 of the VRD system 153 is intended to be coupled. In the example of FIG. 5, the replacement module 204 can be used in place of the first portion of components of the VRD system 153 in circumstances where certain primary components may not have been available. For instance, the one or more parts in first portion of components 154 of the VRD system 153 may be unavailable due to a part failure or is unavailable due to supply reasons. In such a situation, the replacement module 204 can be electrically connected to the POL system 200 via the connections 162 to replace the functionality of the first portion of components 154 of the VRD system 153. As an example, the replacement module 204 could be configured substantially similar to the replacement module 50 in the example of FIG. 2 or the replacement module 100 in the example of FIG. 3.

The replacement module 204 and the corresponding components 158 can thus cooperate to generate an output voltage $V_{OUT}$ in the same manner as the first portion of components 154 of the VRD system 153 in the example of FIG. 4. Accordingly, the examples of FIGS. 4 and 5 demonstrate that the replacement module 204 in the example of FIG. 5 can be a substantial replacement for the VRD system 153 in the example of FIG. 4 for the POL power supply systems 150 and 200, respectively, to generate the output voltage $V_{OUT}$.

While like reference designations have been provided in the example of FIG. 5 for the second portion of components 158 as those demonstrated in the example of FIG. 4, it will be understood that, upon replacing the first portion of components 154 with the replacement module 206, one or more of the circuit components 158 can be replaced, as well. For example, minor variations between the functionality of the VRD system 153 and the replacement module 206 can be corrected based on swapping out one or more of the components 158. Thus, the POL power supply systems 150 and 200 can operate substantially identically, despite variations between the first portion of components 154 of the VRD system 153 (FIG. 4) and the replacement module 206.

Figure 6:
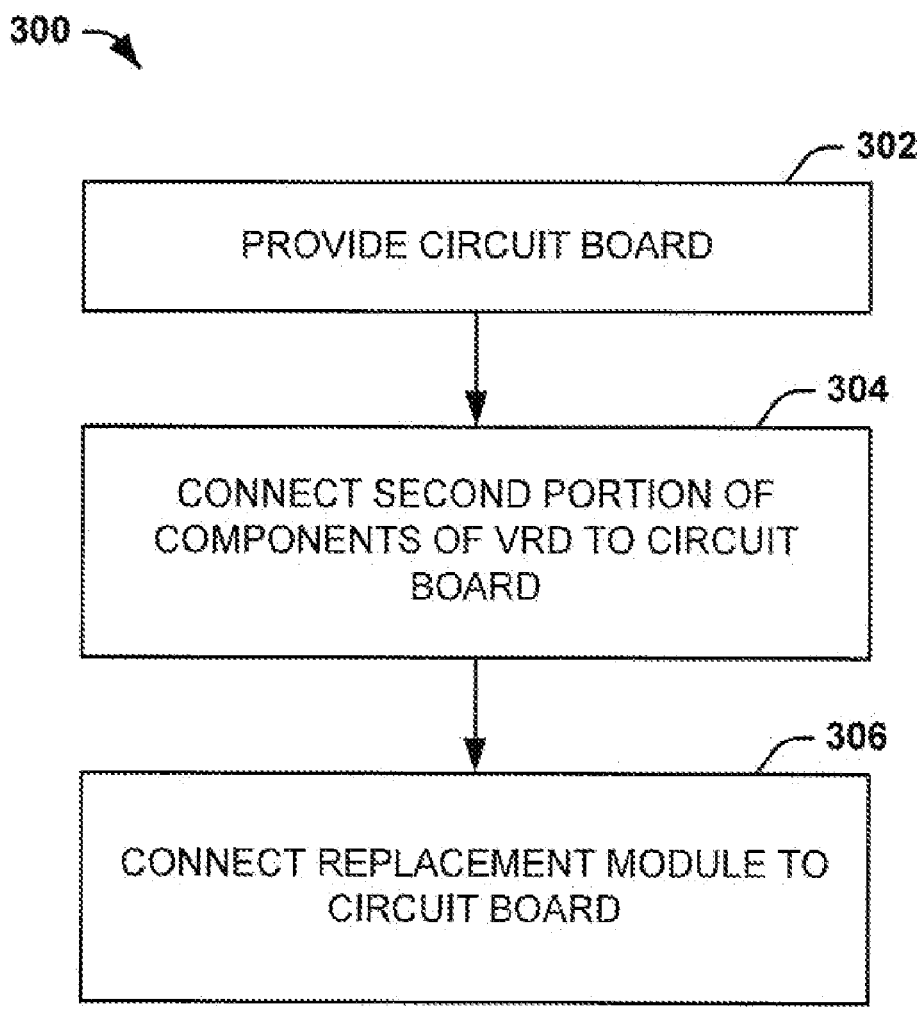
FIG. 6 illustrates an example embodiment of a method for fabricating a POL power supply system onto a circuit board.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with other embodiments, occur in different orders and/or concurrently with other aspects from that shown and described herein. Moreover, not all illustrated features may be required to implement an embodiment of the method.

FIG. 6 illustrates an example embodiment of a method 300 for fabricating a POL power supply system on a circuit board. At 302, the circuit board is provided. The circuit board can be implemented as a motherboard that includes one or more POL power supply system, such as shown and described herein (see, e.g., FIGS. 1 and 4-5). The circuit board includes a first set of connections configured for connecting a first portion of components of a VRD system. The circuit board includes a second set of connections configured for coupling a replacement module to the circuit board. Each of the first set of connections and the second set of connections is electrically coupled with a third set of connections such as via electrical traces running through the circuit board. The third set of connections of the circuit board is configured for coupling a second portion of components of the VRD system to the circuit board. The first and second portion of components of the VRD system collectively defines at least a portion of the POL power supply system. The second (e.g., auxiliary) set of connections (e.g., a socket or arrangement of pads) is configured to receive a replacement module that is designed to replace the function of the first portion of VRD components.

At 304, second portion of components of the VRD system is connected to the circuit board via the third set of connections. The manner of connection can vary depending on the type of components. To enable operation of each of the one or more POL power supply system under diverse conditions, a plurality of traces electrically connect the circuit components associated with the second portion of the POL power supply system to both the first set of connections of the VRD system and the auxiliary connections of the motherboard.

At 306, the replacement module is connected to the circuit board via the second set of connections. The connections can be of the type shown and described herein. As a result of such installation, the replacement module and the second portion of components of the VRD system cooperate to provide at least a portion of the POL system. The number of replacement modules for a given circuit board can match the number of VRD systems on the circuit board or it can be different.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A point of load (POL) power supply system, comprising:
   a voltage regulator down (VRD) system comprising:
      a first set of connections on a circuit board configured for connecting a first portion of components, the first portion of components comprising at least one of a controller, a driver, and one or more switch; and
      a second portion of components connected to the circuit board; and
   a second set of connections on the circuit board configured to receive a replacement module configured to replace the first portion of components, the first set of connections and the second set of connections being electrically connected with the second portion of components, such that the replacement module can be connected to the circuit board via the second set connections to replace functionality of the first portion of components of the VRD system.

2. The system of claim 1, wherein the replacement module is connected to the circuit board via the second set of connections.

3. The system of claim 2, wherein the replacement module comprises at least one of a second controller, a second driver, and one or more switch device.

4. The system of claim 1, further comprising a plurality of electrical traces formed in the circuit board for electrically connecting the second portion of circuit components to the first set of connections and the second set of connections.

5. The system of claim 1, wherein the second set of connections comprises a socket dimensioned and configured to receive corresponding pins of the replacement module.

6. The system of claim 1, wherein the POL power supply system is one of a plurality of POL power supply systems on the circuit board, each of the plurality of POL power supply systems comprising a respective one of the second set of connections configured for receiving a respective replacement module in an auxiliary area of the circuit board.

7. A method for fabricating a point-of-load (POL) power supply system, the method comprising:
   providing a circuit board, the circuit board comprising a first set of connections configured for coupling a predetermined first portion of components of a voltage regulator down (VRD) system to the circuit board, and the circuit board comprising a second set of connections configured for coupling a replacement module to the circuit board, each of the first set of connections and the second set of connections electrically coupled with a third set of connections configured for coupling a second portion of components of the VRD system to the circuit board;
   connecting the second portion of components of the VRD system to the circuit board; and
   connecting the replacement module onto the circuit board via the second set of connections such that the replacement module and the second portion of components of the VRD system cooperate to provide at least a portion of the POL power supply system.

8. The method of claim 1, wherein the second set of connections comprises at least one set of connections arranged in a substantially linear arrangement.

9. The method of claim 1, wherein the second set of connections comprises at least two parallel rows of connections spaced apart from each other.

10. The method of claim 1, wherein the second portion of the VRD system comprises a set of discrete components arranged to provide an output stage of the VRD system, each of the first set of connections and the second set of connections being electrically connected with the output stage of the VRD system.

11. The method of claim 10, wherein the set of discrete components comprises at least one of an inductor, at least one output capacitor, a plurality of feedback resistors, and a set of compensation voltage components.

12. The method of claim 1, wherein the POL power supply system comprises a plurality of POL power supply systems, each of the plurality of POL power supply systems including a VRD system comprising a respective one of the second portion of components, each of the second portion of components of the VRD system being connected to a corresponding first set of connections and to a corresponding second set of connections.

13. The method of claim 12, further comprising connecting a respective replacement module to the circuit board for each of the corresponding second set of connections such that each respective replacement module is electrically connected with a corresponding connection of the second portion of components of each of the plurality of POL power supply systems.

14. The method of claim 1, further comprising testing the POL power supply system with the replacement module connected to the second set of connections.

15. The method of claim 1, wherein the circuit board is a motherboard and the second set of connections comprises a socket.

* * * * *

UNITED STATES PATENT AND TRADEMARK OFFICE
CERTIFICATE OF CORRECTION

PATENT NO. : 8,279,619 B2  
APPLICATION NO. : 12/731687  
DATED : October 2, 2012  
INVENTOR(S) : Howard Leverenz et al.

Page 1 of 1

It is certified that error appears in the above-identified patent and that said Letters Patent is hereby corrected as shown below:

In the Claims:

In column 7, line 44, in Claim 1, after "second set" insert -- of --.

In column 8, line 25, in Claim 8, delete "claim 1," and insert -- claim 7, --, therefor.

In column 8, line 28, in Claim 9, delete "claim 1," and insert -- claim 7, --, therefor.

In column 8, line 31, in Claim 10, delete "claim 1," and insert -- claim 7, --, therefor.

In column 8, line 41, in Claim 12, delete "claim 1," and insert -- claim 7, --, therefor.

In column 8, line 55, in Claim 14, delete "claim 1," and insert -- claim 7, --, therefor.

In column 8, line 58, in Claim 15, delete "claim 1," and insert -- claim 7, --, therefor.

Signed and Sealed this  
Thirtieth Day of April, 2013

Teresa Stanek Rea  
*Acting Director of the United States Patent and Trademark Office*